United States Patent
Iljima et al.

(10) Patent No.: US 9,281,365 B2
(45) Date of Patent: Mar. 8, 2016

(54) SEMICONDUCTOR DEVICE AND METHOD FOR MANUFACTURING THE SAME

(71) Applicant: Kabushiki Kaisha Toshiba, Minato-ku (JP)

(72) Inventors: Ryosuke Iljima, Setagaya (JP); Kazuto Takao, Tsukuba (JP); Chiharu Ota, Kawasaki (JP); Tatsuo Shimizu, Shinagawa (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 27 days.

(21) Appl. No.: 14/463,846

(22) Filed: Aug. 20, 2014

(65) Prior Publication Data

US 2015/0060883 A1 Mar. 5, 2015

(30) Foreign Application Priority Data

Sep. 3, 2013 (JP) .................................. 2013-182599

(51) Int. Cl.
| | | |
|---|---|---|
| H01L 29/15 | (2006.01) | |
| H01L 29/16 | (2006.01) | |
| H01L 21/04 | (2006.01) | |
| H01L 29/423 | (2006.01) | |
| H01L 29/66 | (2006.01) | |
| H01L 29/78 | (2006.01) | |

(52) U.S. Cl.
CPC .......... *H01L 29/1608* (2013.01); *H01L 21/049* (2013.01); *H01L 29/42368* (2013.01); *H01L 29/66068* (2013.01); *H01L 29/7802* (2013.01)

(58) Field of Classification Search
CPC ................... H01L 29/42368; H01L 29/66068; H01L 29/7802

USPC ........................................................... 257/77
See application file for complete search history.

(56) References Cited

U.S. PATENT DOCUMENTS

| | | | |
|---|---|---|---|
| 6,054,352 A | 4/2000 | Ueno | |
| 2006/0079059 A1* | 4/2006 | Snyder et al. | ................. 438/288 |

FOREIGN PATENT DOCUMENTS

| | | | |
|---|---|---|---|
| JP | 5-13458 | A | 1/1993 |
| JP | 7-58717 | B2 | 6/1995 |
| JP | 10-233503 | A | 9/1998 |
| JP | 2009-32921 | A | 2/2009 |
| JP | 2011-29303 | | 2/2011 |
| WO | WO 2011/010407 | A1 | 1/2011 |

* cited by examiner

*Primary Examiner* — Douglas Menz

(74) *Attorney, Agent, or Firm* — Oblon, McClelland, Maier & Neustadt, L.L.P.

(57) ABSTRACT

According to one embodiment, a semiconductor device includes a first semiconductor region, a second semiconductor region, a third semiconductor region, a first electrode, a first insulating section, and a second insulating section. The first semiconductor region includes silicon carbide, is of a first conductivity type and includes first and second parts. The second semiconductor region includes silicon carbide, is of a second conductivity type and is provided on the second part. The third semiconductor region includes silicon carbide, is of the first conductivity type and is provided on the second semiconductor region. The first electrode is provided on the first part and the third semiconductor region. The first insulating section is provided on the third semiconductor region and juxtaposed with the first electrode. The second insulating section is provided between the first electrode and the first part and between the first electrode and the first insulating section.

7 Claims, 14 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2013-182599, filed on Sep. 3, 2013; the entire contents of which are incorporated herein by reference.

FIELD

Embodiments described herein relate generally to a semiconductor device and a method for manufacturing the same.

BACKGROUND

Compared with silicon (Si), silicon carbide (SiC) has superior material properties, such as three times wider band gap, approximately 10 times larger breakdown electric field strength, and approximately three times higher thermal conductivity. Such characteristics of SiC can be used to realize a semiconductor device having low loss and being superior in high temperature operation. The process of manufacturing a semiconductor device based on SiC requires a higher processing temperature of annealing for activating impurities than that based on Si.

DETAILED DESCRIPTION

Figure 1:
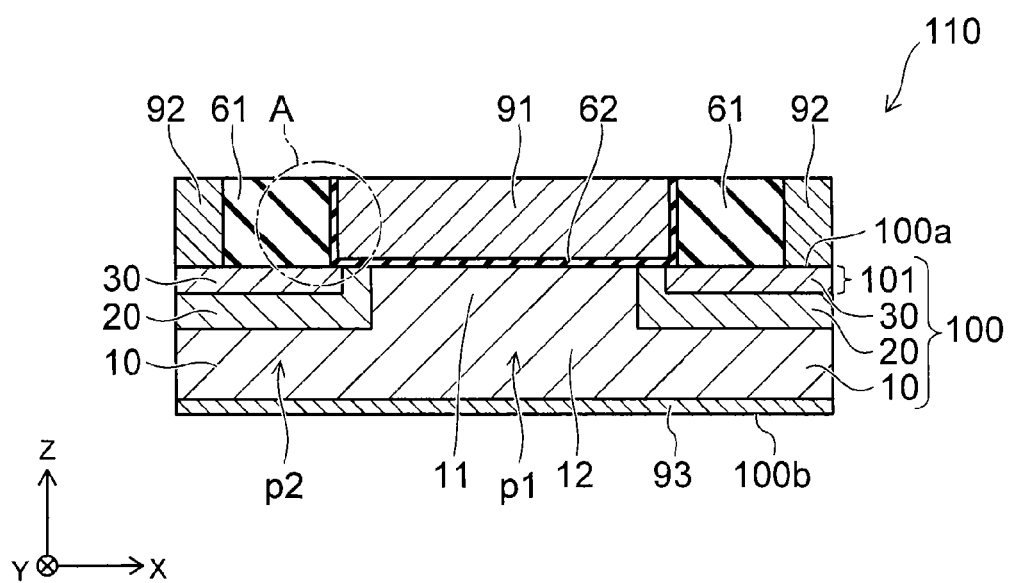
FIG. 1 is a schematic view illustrating the configuration of a semiconductor device according to a first embodiment.

According to one embodiment, a semiconductor device includes a first semiconductor region, a second semiconductor region, a third semiconductor region, a first electrode, a first insulating section, and a second insulating section. The first semiconductor region includes silicon carbide. The first semiconductor region is of a first conductivity type and includes a first part and a second part. The second semiconductor region includes silicon carbide. The second semiconductor region is of a second conductivity type and is provided on the second part. A direction connecting the first part and the second part crosses a stacking direction connecting the second part and the second semiconductor region. The third semiconductor region includes silicon carbide. The third semiconductor region is of the first conductivity type and is provided on the second semiconductor region. The first electrode is provided on the first part and on the third semiconductor region. An end of the first electrode is located on the third semiconductor region. The first insulating section is provided on the third semiconductor region and is juxtaposed with the first electrode in a direction crossing the stacking direction. The second insulating section is provided between the first electrode and the first part and between the first electrode and the first insulating section.

According to one embodiment, a semiconductor device includes a first semiconductor region, a second semiconductor region, a third semiconductor region, a first electrode, a first insulating section, and a second insulating section. The first semiconductor region includes silicon carbide. The first semiconductor region is of a first conductivity type and includes a first part and a second part. The second semiconductor region includes silicon carbide. The second semiconductor region is of a second conductivity type and is provided on the second part. A direction connecting the first part and the second part crosses a stacking direction connecting the second part and the second semiconductor region. The third semiconductor region includes silicon carbide. The third semiconductor region is of the first conductivity type and is provided on a part of the second semiconductor region. The first electrode is provided on the first part, on another part of the second semiconductor region, and on the third semiconductor region. An end of the first electrode is located on the third semiconductor region. The first insulating section is provided on the third semiconductor region, is juxtaposed with the first electrode in a direction crossing the stacking direction, and is in contact with the first electrode. The second insulating section is provided between the first electrode and the first part, between the other part of the second semiconductor region and the first electrode, and between the third semiconductor region and the first electrode. A first film thickness of the second insulating section between the other part of the second semiconductor region and the first electrode is thinner than a second film thickness of the second insulating section between the third semiconductor region and the first electrode.

According to one embodiment, a method is disclosed for manufacturing a semiconductor device. The method can include forming a first mask on a part of a first semiconductor region of a first conductivity type including silicon carbide, and then forming a second semiconductor region of a second conductivity type by implanting first ions into the first semiconductor region through the first mask. The method can include forming a second mask on a part of the second semiconductor region and adjacent to the first mask, and then forming a third semiconductor region of the first conductivity type by implanting second ions into the second semiconductor region through the first mask and the second mask. The method can include activating the first ions and the second ions by heat treatment, forming a first insulating section adjacent to the second mask, and removing the first mask and the second mask. In addition, the method can include forming a second insulating section on an exposed surface of the first semiconductor region, an exposed surface of the second semiconductor region, and an exposed surface of the third semiconductor region exposed by removal of the first mask and the second mask, and forming a first electrode on the second insulating section.

Various embodiments will be described hereinafter with reference to the accompanying drawings. In the following description, like members are labeled with like reference numerals, and the description of the members once described is omitted appropriately. In the following description, the notations of $n^+$, n, $n^-$ and $p^+$, p, $p^-$ represent relative magnitude of impurity concentration in each conductivity type. The symbol $n^+$ represents relatively higher n-type impurity concentration than n, and $n^-$ represents relatively lower n-type impurity concentration than n. The symbol $p^+$ represents relatively higher p-type impurity concentration than p, and $p^-$ represents relatively lower p-type impurity concentration than p. In the following description, by way of example, the first conductivity type is n-type, and the second conductivity type is p-type.

(First Embodiment)

FIG. 1 is a schematic view illustrating the configuration of a semiconductor device according to a first embodiment.

As shown in FIG. 1, the semiconductor device 110 according to the first embodiment includes a structural body 100, a first electrode 91, a first insulating section 61, and a second insulating section 62. The semiconductor device 110 is a MOSFET (metal oxide semiconductor field effect transistor) including SiC.

The structural body 100 has a first surface 100a and a first portion 101 along the first surface 100a. The structural body 100 has a second surface 100b on the opposite side from the first surface 100a. In the embodiment, the direction orthogonal to the first surface 100a is referred to as Z-direction. One of the directions orthogonal to the Z-direction is referred to as X-direction. The direction orthogonal to the Z-direction and the X-direction is referred to as Y-direction. The direction from the second surface 100b toward the first surface 100a is referred to as "above" (upper side), and the opposite direction is referred to as "below" (lower side).

The structural body 100 includes a first semiconductor region 10, a second semiconductor region 20, and a third semiconductor region 30. The first semiconductor region 10 includes SiC of a first conductivity type (n-type). The first semiconductor region 10 includes an $n^+$-type region provided on the second surface 100b side, and an $n^-$-type region provided between the $n^+$-type region and the first surface 100a. The $n^+$-type region is e.g. a SiC substrate. The $n^-$-type region is e.g. a region formed by epitaxial growth on the SiC substrate. In the embodiment, these are referred to as first semiconductor region 10 without distinction for convenience of description.

The first semiconductor region 10 includes a first region 11 and a second region 12. The first region 11 is provided on a part of the second region 12. The first region 11 is a JFET (junction field effect transistor) region of the MOSFET. The second region 12 is a drift region of the MOSFET. The first semiconductor region 10 includes a first part p1 and a second part p2. The direction connecting the first part p1 and the second part p2 crosses the X-direction. The first region 11 and the portion of the second region 12 stacked with the first region 11 are included in the first part p1. The portion of the second region 12 not overlapping the first region 11 corresponds to the second part p2.

The second semiconductor region 20 includes SiC of a second conductivity type (p-type). The second semiconductor region 20 is provided on the first semiconductor region 10. The second semiconductor region 20 is provided on the second part p2. The second semiconductor region 20 is a region formed by ion implantation in the surface part of the first semiconductor region 10 on the first surface 100a side. The second semiconductor region 20 is a base region of the MOSFET. The direction connecting the second part p2 and the second semiconductor region 20 corresponds to the stacking direction (Z-direction). The direction connecting the first part p1 and the second part p2 crosses the stacking direction (Z-direction).

The third semiconductor region 30 includes SiC of the first conductivity type ($n^+$-type). The third semiconductor region 30 is provided on the second semiconductor region 20. The third semiconductor region 30 is a region formed by ion implantation in the surface part of the second semiconductor region 20 on the first surface 100a side.

The first portion 101 is a portion of the surface part of the structural body 100 on the first surface 100a side. In the first portion 101, a part of the first semiconductor region 10, a part of the second semiconductor region 20, and a part of the third semiconductor region 30 are arranged in this order along the first surface 100a.

The first electrode 91 is provided on the first portion 101. The first electrode 91 is a gate electrode in the MOSFET. The first electrode 91 is provided on the first surface 100a and on the first semiconductor region 10, the second semiconductor region 20, and the third semiconductor region 30.

The first insulating section 61 is provided on the third semiconductor region 30. The first insulating section 61 is juxtaposed with the first electrode 91 along the first surface 100a. The first insulating section 61 is an interlayer insulating film in the MOSFET.

The second insulating section 62 is provided between the first electrode 91 and the first portion 101, and between the first electrode 91 and the first insulating section 61. The second insulating section 62 provided between the first electrode 91 and the second semiconductor region 20 is a gate insulating film in the MOSFET.

The second semiconductor region 20 is a p-type well of the MOSFET. In the first portion 101, the second semiconductor region 20 constitutes a portion in which a channel is formed (channel portion). The channel portion is provided near the boundary of the second semiconductor region 20 with the first surface 100a in the first portion 101. In the first portion 101, the third semiconductor region 30 constitutes a source region in the MOSFET.

The semiconductor device 110 further includes a second electrode 92 and a third electrode 93. The second electrode 92 is in electrical continuity with the third semiconductor region 30. The second electrode 92 is in contact with the third semiconductor region 30 at the first surface 100a. The second electrode 92 is a source electrode in the MOSFET. The first insulating section 61 is provided between the first electrode 91 and the second electrode 92.

The third electrode 93 is in electrical continuity with the first semiconductor region 10. The third electrode 93 is in contact with the first semiconductor region 10 at the second surface 100b. The third electrode 93 is a drain electrode in the MOSFET. The third electrode 93 is provided on all or a part of the second surface 100b.

In the semiconductor device 110, the first electrode 91 and the first region 11 extend in e.g. the Y-direction. In the semiconductor device 110, the second semiconductor region 20 and the third semiconductor region 30 are each provided on both sides of the first region 11. With respect to the YZ-plane passing through the center of the first electrode 91, the second semiconductor region 20 on one side is provided in plane symmetry with the second semiconductor region 20 on the other side. With respect to the YZ-plane passing through the center of the first electrode 91, the third semiconductor region 30 on one side is provided in plane symmetry with the third semiconductor region 30 on the other side.

In the semiconductor device 110, the upper surface of the first insulating section 61 is flush with the upper surface of the first electrode 91. The upper surface of the first insulating section 61 and the upper surface of the first electrode 91 are planarized by processing such as CMP (chemical mechanical polishing) in the manufacturing method described later.

Next, the operation of the semiconductor device 110 is described.

The third electrode 93 is applied with a positive voltage relative to the second electrode 92. In this state, the first electrode 91 is applied with a voltage higher than or equal to the threshold. Then, an inversion layer (channel) is formed in the neighborhood (channel part) of the interface of the second semiconductor region 20 with the second insulating section 62. This turns on the semiconductor device 110, and allows a current to flow from the third electrode 93 to the second electrode 92.

On the other hand, when the voltage applied to the first electrode 91 is lower than the threshold, the channel vanishes. This turns off the semiconductor device 110, and blocks the current flowing from the third electrode 93 to the second electrode 92.

Figure 2A:
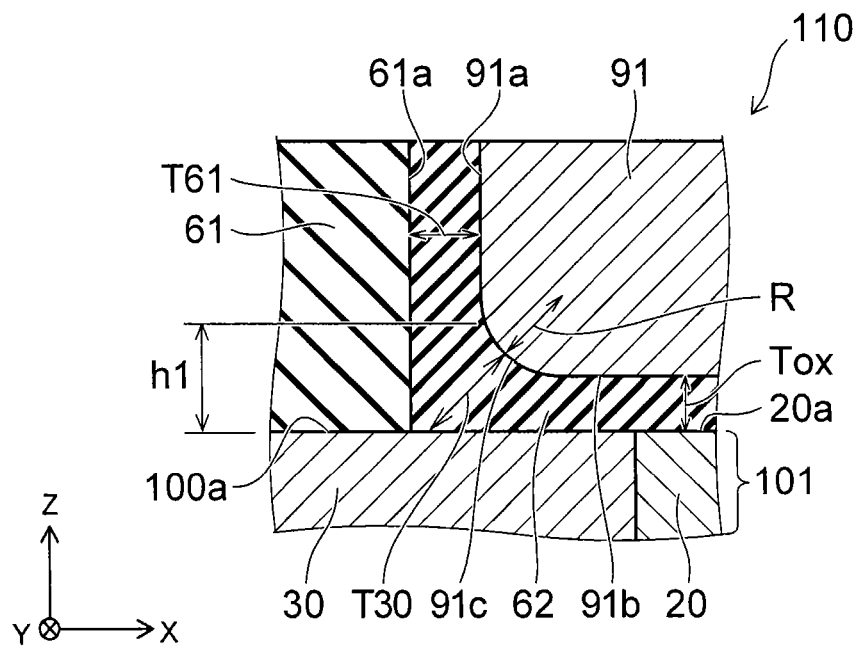
FIGS. 2A and 2B are schematic sectional views enlarging a part of the semiconductor device.
Figure 2B:
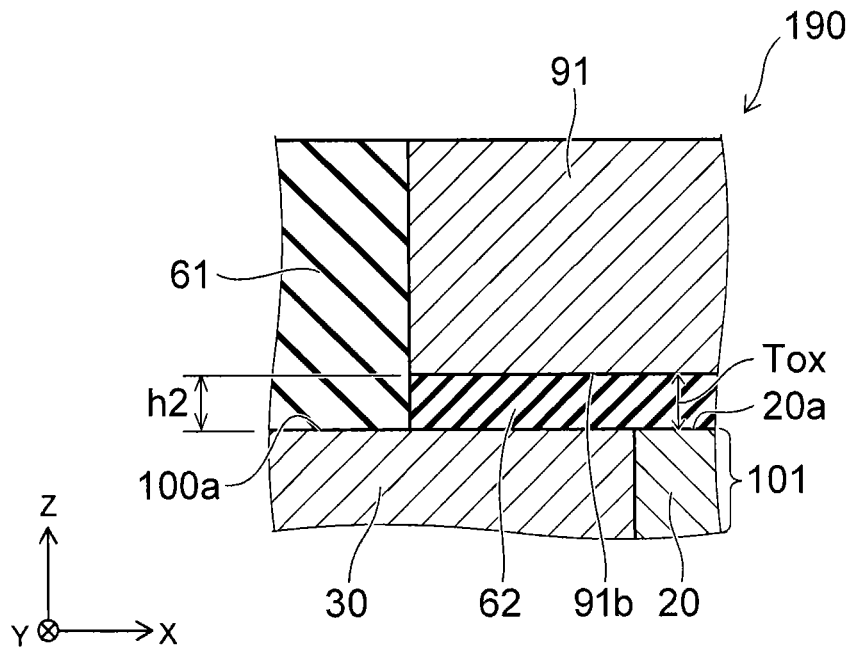

FIGS. 2A and 2B are schematic sectional views enlarging a part of the semiconductor device.

FIG. 2A is an enlarged view of a part A shown in FIG. 1. FIG. 2B shows an alternative example.

As shown in FIG. 2A, the first electrode 91 of the semiconductor device 110 has a side surface 91a, a bottom surface 91b, and a curved surface 91c. The side surface 91a is an outer peripheral surface of the first electrode 91 opposed to the first insulating section 61. The side surface 61a of the first insulating section 61 is opposed to the side surface 91a of the first electrode 91. The bottom surface 91b is an outer peripheral surface of the first electrode 91 opposed to the first portion 101. The curved surface 91c is an outer peripheral surface of the first electrode 91 provided between the side surface 91a and the bottom surface 91b.

The surface of the second insulating section 62 in contact with the first electrode 91 lies along the side surface 91a, the bottom surface 91b, and the curved surface 91c of the first electrode 91. The surface of the second insulating section 62 in contact with the first insulating section 61 and the first portion 101 does not include any curved surface having a curvature radius larger than or equal to the curvature radius R of the curved surface 91c.

The film thickness (Z-direction thickness) of the second insulating section 62 between the first electrode 91 and the second semiconductor region 20 is denoted by Tox. The semiconductor device 110 preferably satisfies $R > Tox \times (3^{1/2} - 1)$.

In the semiconductor device 110, the thickness T30 of the second insulating section 62 in the direction orthogonal to the curved surface 91c is thicker than the thickness Tox of the second insulating section 62 in the direction orthogonal to the bottom surface 91b. In the semiconductor device 110, the thickness T30 of the second insulating section 62 in the direction orthogonal to the curved surface 91c is thicker than the thickness T61 of the second insulating section 62 in the direction orthogonal to the side surface 91a.

In contrast, as shown in FIG. 2B, in the semiconductor device 190 according to the alternative example, the thickness Tox of the second insulating section 62 in the direction orthogonal to the bottom surface 91b of the first electrode 91 is nearly constant.

In the semiconductor device 110, the film thickness h1 in the Z-direction of the second insulating section 62 at the position of the curved surface 91c is thicker than the film thickness h2 in the Z-direction of the second insulating section 62 of the semiconductor device 190. Thus, the gate-source capacitance is reduced. The semiconductor device 110 achieves faster switching characteristics than the semiconductor device 190.

Next, a method for manufacturing the semiconductor device 110 is described.

FIGS. 3A to 5B are schematic sectional views illustrating a method (I) for manufacturing a semiconductor device.

Figure 3A:
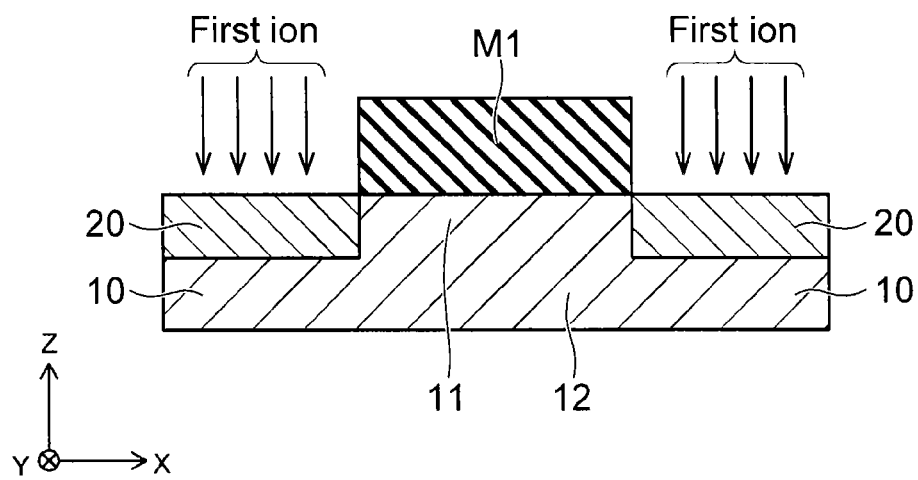
FIGS. 3A and 3B are schematic sectional views illustrating a method (I) for manufacturing a semiconductor device.

First, as shown in FIG. 3A, a first semiconductor region 10 including SiC is prepared. Then, a first mask M1 is formed on a part of the first semiconductor region 10. The material of the first mask M1 is at least one selected from the group consisting of e.g. tantalum carbide (TaC, $Ta_2C$), tungsten (W), manganese dioxide ($MnO_2$), magnesium oxide (MgO), aluminum oxide ($Al_2O_3$), and carbon (C). The melting point of the material of the first mask M1 is higher than the melting point of polycrystalline silicon. The material of the first mask M1 is what is called a high melting point material. The first mask M1 is formed with a prescribed size and position by e.g. photolithography and etching.

Next, first ions are implanted into the first semiconductor region 10 through the first mask M1. The first ions are impurity ions of the second conductivity type. The first ions are ions of at least one of e.g. aluminum (Al), boron (B), and gallium (Ga). By implanting the first ions, a second semiconductor region 20 is formed in the surface portion of the first semiconductor region 10 not overlapping the first mask M1 as viewed in the Z-direction.

Figure 3B:
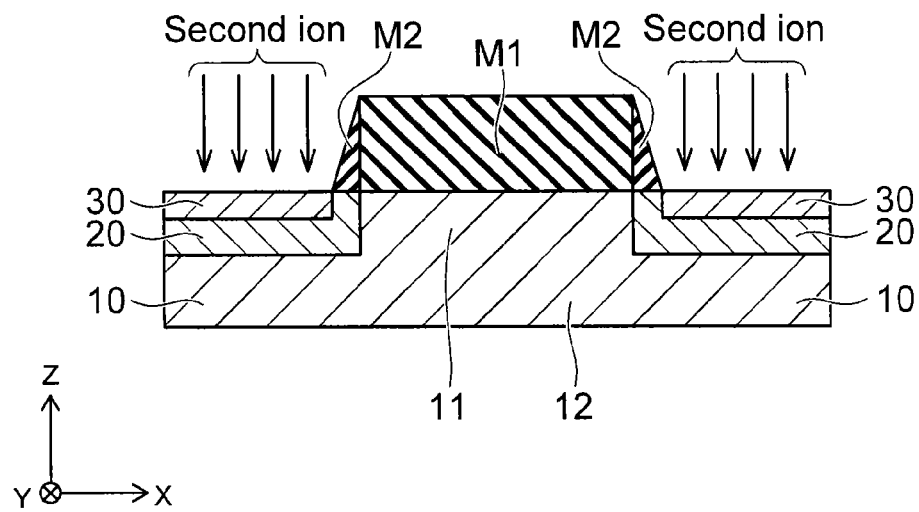

Next, as shown in FIG. 3B, a second mask M2 is formed. The second mask M2 is provided on a part of the second semiconductor region 20 at the position adjacent to the first mask M1. For instance, the second mask M2 is formed with a prescribed thickness on the sidewall of the first mask M1. The material of the second mask M2 is at least one selected from the group consisting of e.g. TaC, $Ta_2C$, W, $MnO_2$, MgO, $Al_2O_3$, and C. The melting point of the material of the second mask M2 is higher than the melting point of polycrystalline silicon. The material of the second mask M2 is what is called a high melting point material.

The second mask M2 is formed with a prescribed size and position by e.g. photolithography and etching. The thickness (X-direction thickness) of the second mask M2 at the position in contact with the second semiconductor region 20 is determined based on the length of the channel portion (channel length).

Next, second ions are implanted into the second semiconductor region 20 through the second mask M2. The second ions are impurity ions of the first conductivity type. The second ions are ions of at least one of e.g. phosphorus (P), nitrogen (N), and arsenic (As). By implanting the second ions, a third semiconductor region 30 is formed in the surface portion of the second semiconductor region 20 not overlapping the first mask M1 and the second mask M2 as viewed in the Z-direction.

Figure 4A:
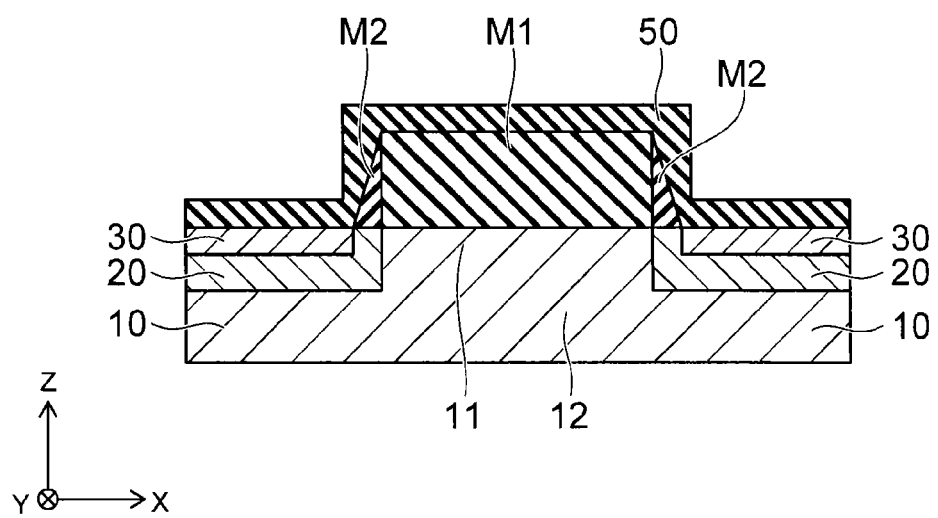
FIGS. 4A and 4B are schematic sectional views illustrating a method (I) for manufacturing a semiconductor device.

Next, as shown in FIG. 4A, a protective film 50 is formed. The protective film 50 is formed on the first mask M1, the second mask M2, and the third semiconductor region 30. The protective film 50 is made of e.g. C.

After forming the protective film 50, annealing is performed. The first ions implanted into the second semiconductor region 20 and the second ions implanted into the third semiconductor region 30 are activated by annealing. The annealing temperature is e.g. 1600° C. or more and 1900° C. or less. After annealing, the protective film 50 is removed.

Figure 4B:
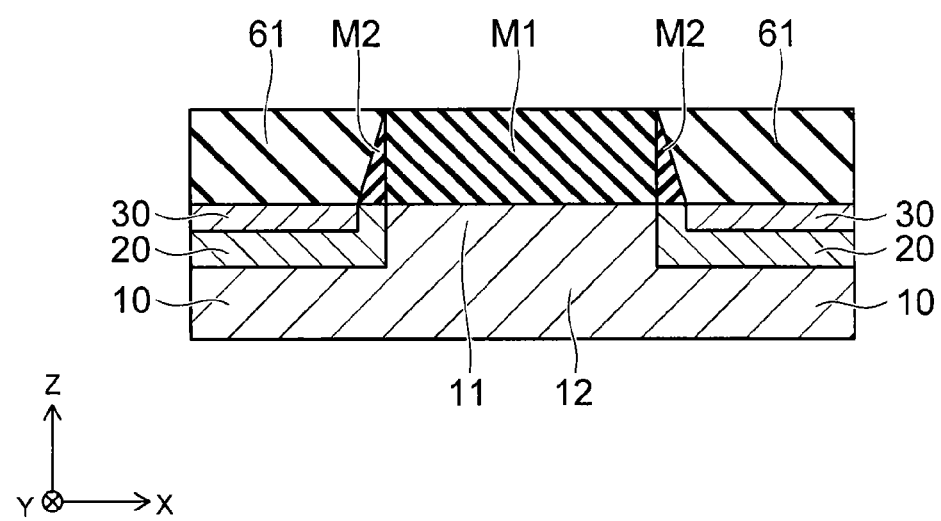

Next, as shown in FIG. 4B, a first insulating section 61 is formed. The first insulating section 61 is formed adjacent to the second mask M2. The first insulating section 61 is made of e.g. silicon oxide ($SiO_2$). The first insulating section 61 is formed by e.g. CVD (chemical vapor deposition).

Figure 5A:
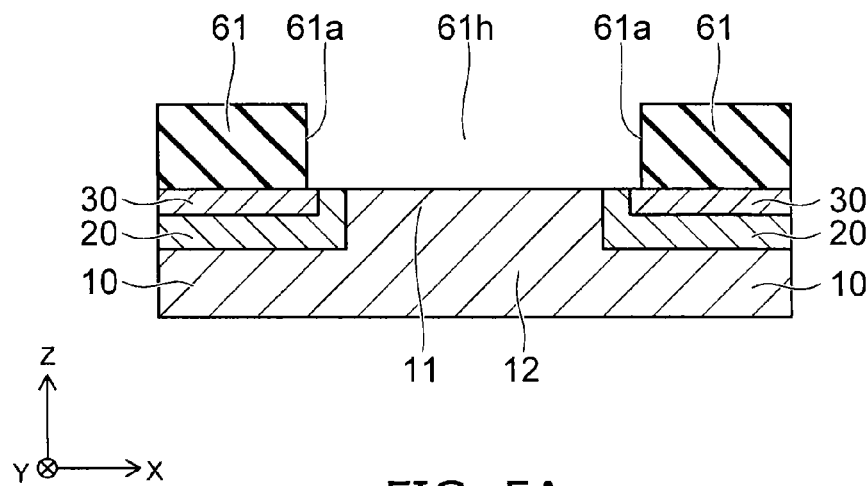
FIGS. 5A and 5B are schematic sectional views illustrating a method (I) for manufacturing a semiconductor device.

Next, as shown in FIG. 5A, the first mask M1 and the second mask M2 are removed. The first mask M1 and the second mask M2 are removed by at least one of e.g. dry etching and wet etching. This etching is performed under the condition such that the etching rate of the first mask M1 and the second mask M2 is higher than the etching rate of the material of the first insulating section 61.

A recess 61h is formed by the removal of the first mask M1 and the second mask M2. Here, when the first mask M1 and the second mask M2 are etched, the first insulating section 61 is slightly removed. The side surface 61a of the first insulating section 61 is set back by a prescribed amount from the end part of the third semiconductor region 30. Thus, the first semiconductor region 10, the second semiconductor region 20, and the third semiconductor region 30 are exposed at the bottom of the recess 61h.

Figure 5B:
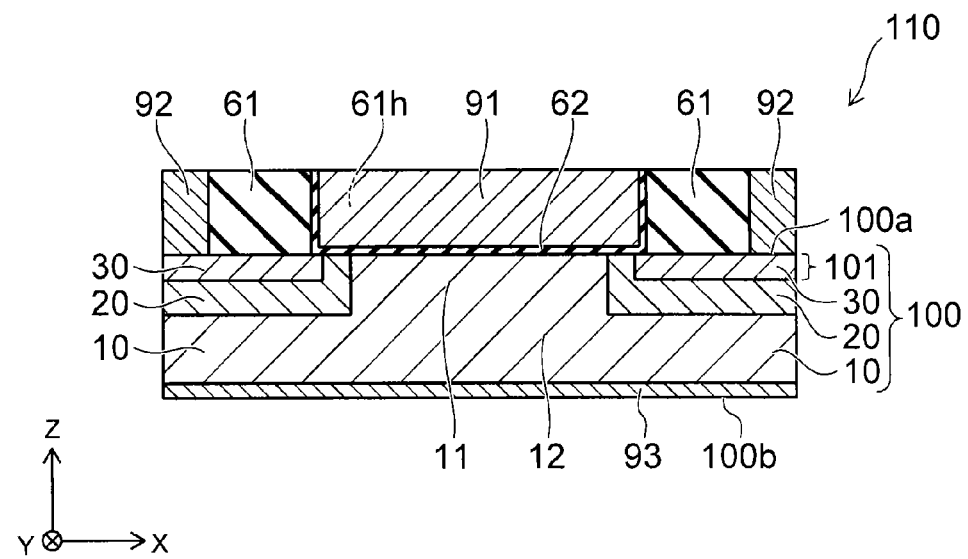

Next, as shown in FIG. 5B, a second insulating section 62 and a first electrode 91 are formed. The second insulating section 62 is formed inside the recess 61h. The second insulating section 62 is made of at least one of e.g. tetraethyl orthosilicate (TEOS) including ammonia ($NH_3$) and silicon oxynitride (SiON). In the case where the second insulating section 62 is made of SiON, it is preferable that nitrogen (N) be added at high concentration.

The second insulating section 62 is formed by e.g. CVD. The second insulating section 62 is formed on the exposed surface of the first semiconductor region 10, the exposed surface of the second semiconductor region 20, and the exposed surface of the third semiconductor region 30 exposed from the recess 61h. The second insulating section 62 is formed also on the side surface 61a of the first insulating section 61 exposed from the recess 61h.

After forming the second insulating section 62, a first electrode 91 is formed on the second insulating section 62. The first electrode 91 is made of e.g. polycrystalline silicon. The first electrode 91 is embedded in the recess 61h via the second insulating section 62. The material of the first electrode 91 is formed in the recess 61h and on the first insulating section 61 by e.g. CVD. Then, the surface of the material of the first electrode 91 is planarized by e.g. CMP. The planarization is performed until the first insulating section 61 is exposed. Thus, the first electrode 91 is formed.

After forming the first electrode 91, a second electrode 92 and a third electrode 93 are formed. The semiconductor device 110 is completed.

By this manufacturing method, the second semiconductor region 20 is formed by self-alignment by the first mask M1. The third semiconductor region 30 is formed by self-alignment by the second mask M2. The second insulating section 62 and the first electrode 91 are formed at an accurate position by the recess 61h formed by the removal of the first mask M1 and the second mask M2.

The recess 61h corresponds to the position of the first mask M1 and the second mask M2. Thus, the second insulating section 62 and the first electrode 91 are formed substantially by self-alignment by the first mask M1 and the second mask M2.

In the semiconductor device 110 formed by this manufacturing method, the overlap of the first electrode 91 and the third semiconductor region 30 as viewed in the Z-direction is accurately formed. Even in the case where the channel length is miniaturized, each portion is formed at an accurate position. Thus, the semiconductor device 110 achieves compatibility between miniaturization and stable characteristics.

FIGS. 6A to 8B are schematic sectional views illustrating a method (II) for manufacturing a semiconductor device.

Figure 6A:
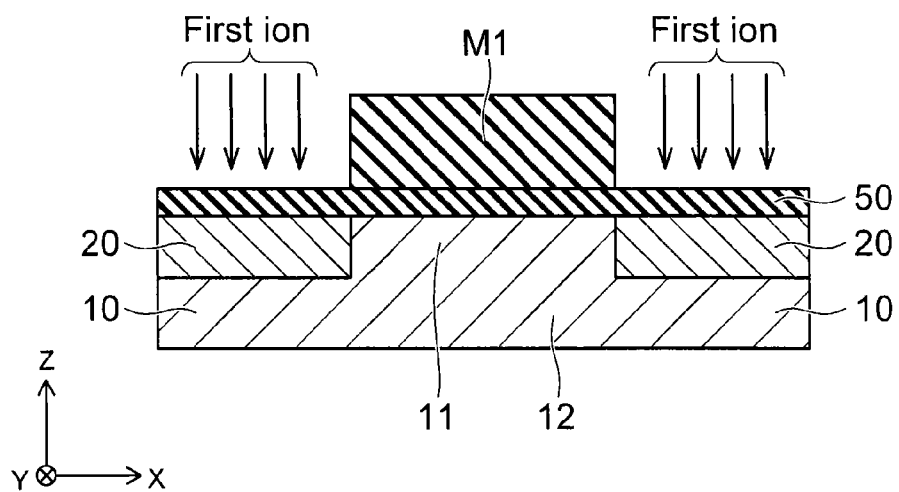
FIGS. 6A and 6B are schematic sectional views illustrating a method (II) for manufacturing a semiconductor device.

First, as shown in FIG. 6A, a first semiconductor region 10 including SiC is prepared. Then, a protective film 50 is formed on the first semiconductor region 10. The protective film 50 is made of e.g. C. Then, a first mask M1 is formed on a part of the protective film 50.

Next, first ions are implanted into the first semiconductor region 10 below the protective film 50 through the first mask M1. The first ions are impurity ions of the second conductivity type. The first ions are ions of at least one of e.g. Al, B, and Ga. By implanting the first ions, a second semiconductor region 20 is formed in the surface portion of the first semiconductor region 10 not overlapping the first mask M1 as viewed in the Z-direction.

Figure 6B:
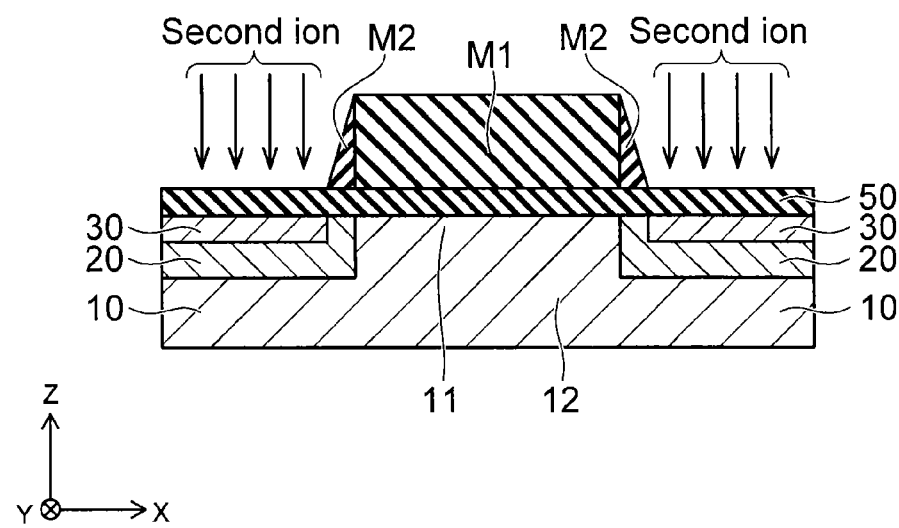

Next, as shown in FIG. 6B, a second mask M2 is formed. The second mask M2 is provided on the part of the second semiconductor region 20 at the position adjacent to the first mask M1 as viewed in the Z-direction. For instance, the second mask M2 is formed with a prescribed thickness on the sidewall of the first mask M1. The thickness (X-direction thickness) of the second mask M2 at the position in contact with the protective film 50 is determined based on the length of the channel portion (channel length).

Next, second ions are implanted into the second semiconductor region 20 below the protective film 50 through the second mask M2. The second ions are impurity ions of the first conductivity type. The second ions are ions of e.g. P, N, and As. By implanting the second ions, a third semiconductor region 30 is formed in the surface portion of the second semiconductor region 20 not overlapping the first mask M1 and the second mask M2 as viewed in the Z-direction.

Figure 7A:
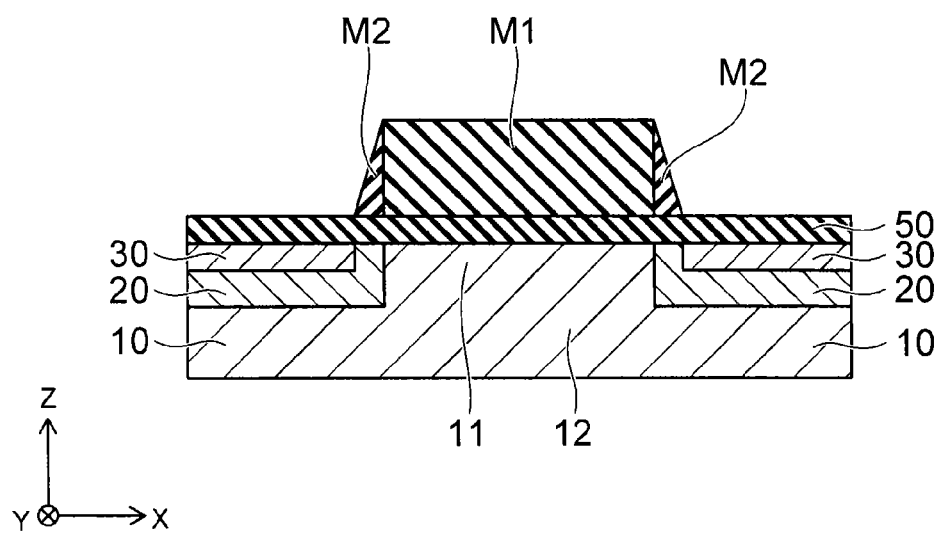
FIGS. 7A and 7B are schematic sectional views illustrating a method (II) for manufacturing a semiconductor device.

Next, as shown in FIG. 7A, annealing is performed. The first ions implanted into the second semiconductor region 20 and the second ions implanted into the third semiconductor region 30 are activated by annealing. The annealing temperature is e.g. 1600° C. or more and 1900° C. or less. After annealing, the protective film 50 other than the portion below the first mask M1 and the second mask M2 as viewed in the Z-direction is removed.

Figure 7B:
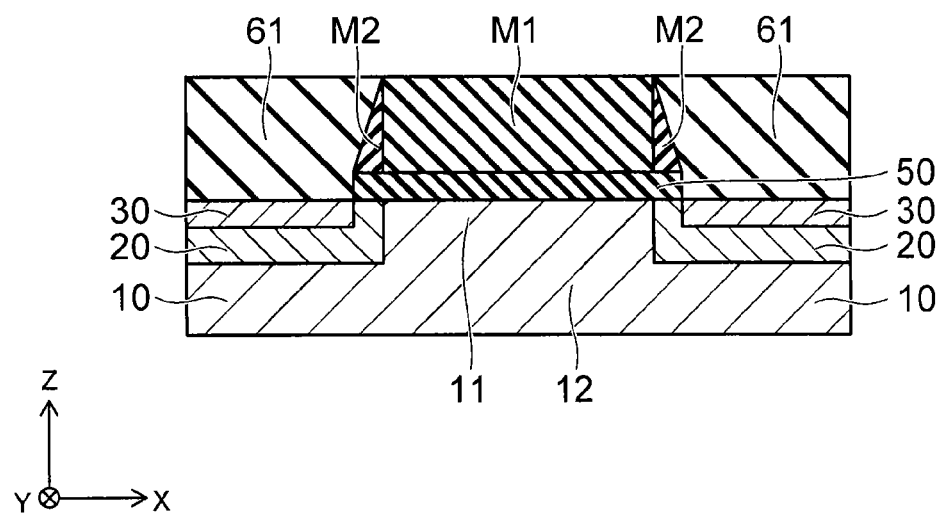

Next, as shown in FIG. 7B, a first insulating section 61 is formed. The first insulating section 61 is formed adjacent to the second mask M2. The first insulating section 61 is made of e.g. $SiO_2$. The first insulating section 61 is formed by e.g. CVD.

Figure 8A:
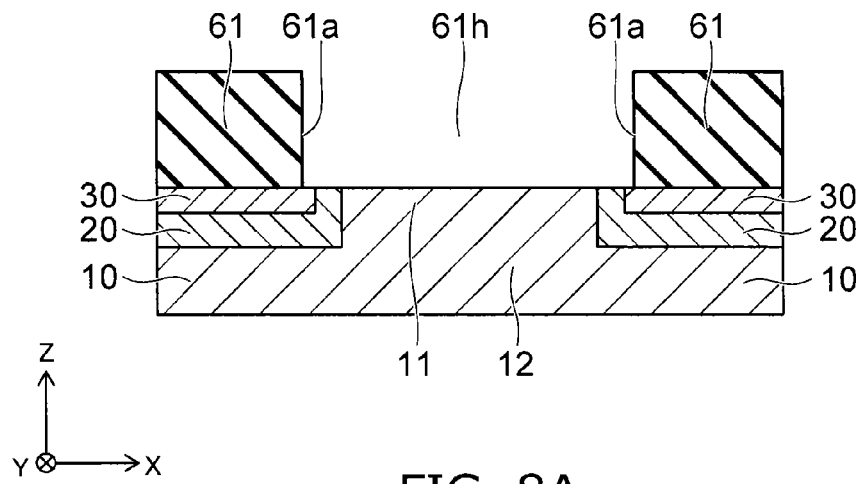
FIGS. 8A and 8B are schematic sectional views illustrating a method (II) for manufacturing a semiconductor device.

Next, as shown in FIG. 8A, the first mask M1, the second mask M2, and the protective film 50 are removed. The first mask M1, the second mask M2, and the protective film 50 are removed by at least one of e.g. dry etching and wet etching. This etching is performed under the condition such that the etching rate of the first mask M1, the second mask M2, and the protective film 50 is higher than the etching rate of the material of the first insulating section 61.

A recess 61h is formed by the removal of the first mask M1, the second mask M2, and the protective film 50. Here, when the first mask M1, the second mask M2, and the protective film 50 are etched, the first insulating section 61 is slightly removed. The side surface 61a of the first insulating section 61 is set back by a prescribed amount from the end part of the third semiconductor region 30. Thus, the first semiconductor region 10, the second semiconductor region 20, and the third semiconductor region 30 are exposed at the bottom of the recess 61h.

Figure 8B:
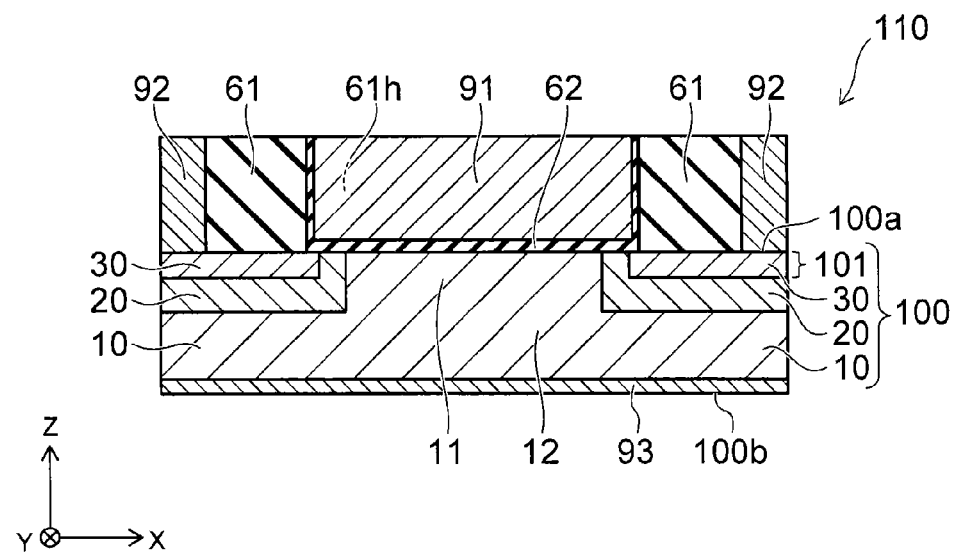

Next, as shown in FIG. 8B, a second insulating section 62 and a first electrode 91 are formed. The second insulating section 62 is formed inside the recess 61h. The second insulating section 62 is made of at least one of e.g. TEOS including $NH_3$ and SiON. In the case where the second insulating section 62 is made of SiON, it is preferable that nitrogen N be added at high concentration.

The second insulating section 62 is formed by e.g. CVD. The second insulating section 62 is formed on the exposed surface of the first semiconductor region 10, the exposed surface of the second semiconductor region 20, and the exposed surface of the third semiconductor region 30 exposed from the recess 61h. The second insulating section 62 is formed also on the side surface 61a of the first insulating section 61 exposed from the recess 61h.

After forming the second insulating section 62, a first electrode 91 is formed on the second insulating section 62. The first electrode 91 is made of e.g. polycrystalline silicon. The first electrode 91 is embedded in the recess 61h via the second insulating section 62. The material of the first electrode 91 is formed in the recess 61h and on the first insulating section 61 by e.g. CVD. Then, the surface of the material of the first electrode 91 is planarized by e.g. CMP. The planarization is performed until the first insulating section 61 is exposed. Thus, the first electrode 91 is formed.

After forming the first electrode 91, a second electrode 92 and a third electrode 93 are formed. Thus, the semiconductor device 110 is completed.

By this manufacturing method, the second semiconductor region 20 is formed by self-alignment by the first mask M1. The third semiconductor region 30 is formed by self-alignment by the second mask M2. The second insulating section 62 and the first electrode 91 are formed at an accurate position by the recess 61h formed by the removal of the first mask M1 and the second mask M2.

The recess 61h corresponds to the position of the first mask M1 and the second mask M2. Thus, the second insulating section 62 and the first electrode 91 are formed substantially by self-alignment by the first mask M1 and the second mask M2.

In the semiconductor device 110 formed by this manufacturing method, the overlap of the first electrode 91 and the third semiconductor region 30 as viewed in the Z-direction is accurately formed. Even in the case where the channel length is miniaturized, each portion is formed at an accurate position. Thus, the semiconductor device 110 achieves compatibility between miniaturization and stable characteristics. Furthermore, the protective film 50 is formed on the flat surface of the first semiconductor region 10. Thus, a stable protective film 50 is formed.

FIGS. 9A to 12B are schematic sectional views illustrating a method (III) for manufacturing a semiconductor device.

Figure 9A:
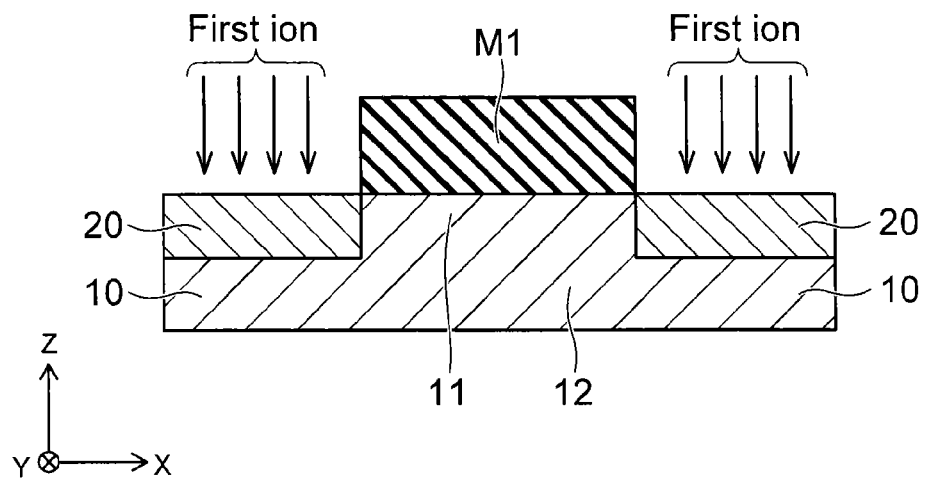
FIGS. 9A and 9B are schematic sectional views illustrating a method (III) for manufacturing a semiconductor device.

First, as shown in FIG. 9A, a first semiconductor region 10 including SiC is prepared. Then, a first mask M1 is formed on the part of the first semiconductor region 10. The first mask M1 is made of a material including C. The first mask M1 is formed with a prescribed size and position by e.g. photolithography and etching.

Next, first ions are implanted into the first semiconductor region 10 through the first mask M1. The first ions are impurity ions of the second conductivity type. The first ions are ions of e.g. Al, B, and Ga. By implanting the first ions, a second semiconductor region 20 is formed in the surface portion of the first semiconductor region 10 not overlapping the first mask M1 as viewed in the Z-direction.

Figure 9B:
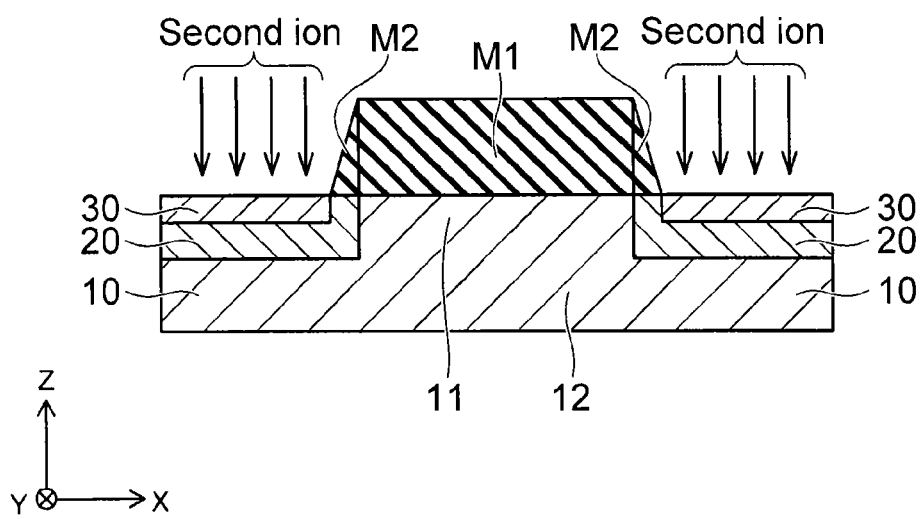

Next, as shown in FIG. 9B, a second mask M2 is formed. The second mask M2 is provided on the part of the second semiconductor region 20 at the position adjacent to the first mask M1. For instance, the second mask M2 is formed with a prescribed thickness on the sidewall of the first mask M1. The second mask M2 is made of a material including C. The material of the second mask M2 is preferably the same as the material of the first mask M1. The second mask M2 is formed with a prescribed size and position by e.g. photolithography and etching. The thickness (X-direction thickness) of the second mask M2 at the position in contact with the second semiconductor region 20 is determined based on the length of the channel portion (channel length).

Next, second ions are implanted into the second semiconductor region 20 through the second mask M2. The second ions are impurity ions of the first conductivity type. The second ions are ions of e.g. P, N, and As. By implanting the second ions, a third semiconductor region 30 is formed in the surface portion of the second semiconductor region 20 not overlapping the first mask M1 and the second mask M2 as viewed in the Z-direction.

Figure 10A:
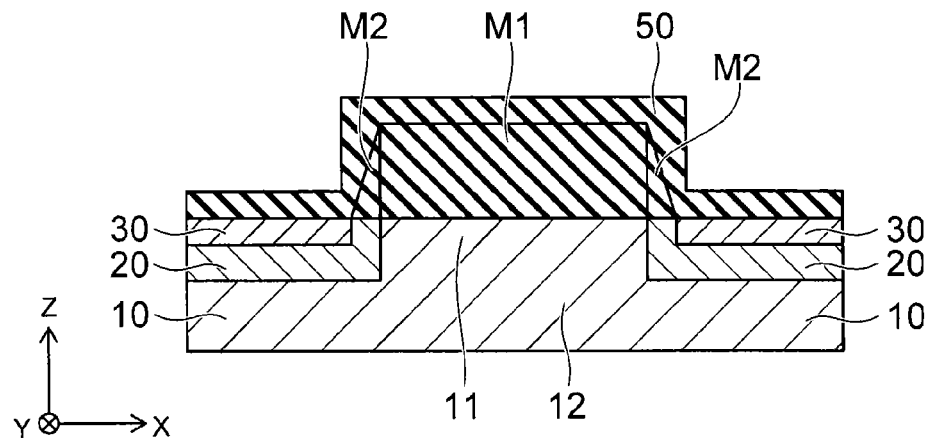
FIGS. 10A and 10B are schematic sectional views illustrating a method (III) for manufacturing a semiconductor device.
Figure 10B:
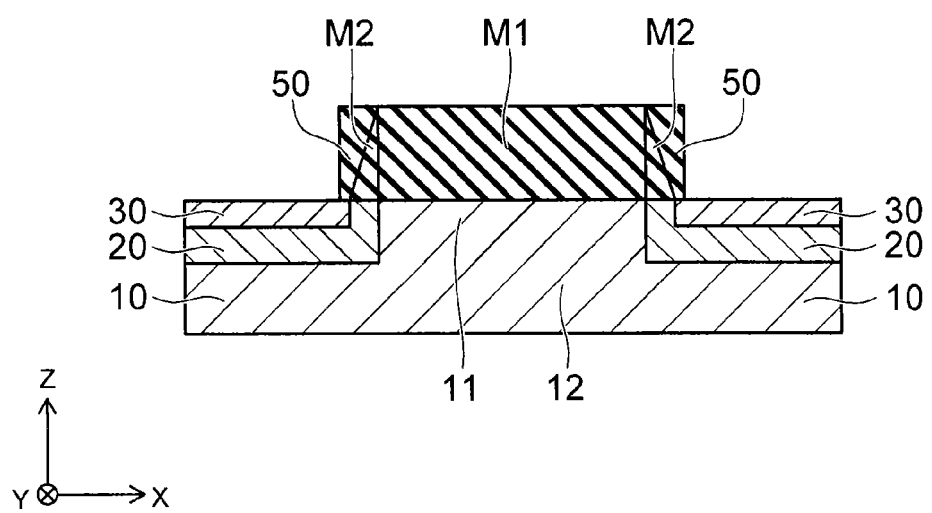

Next, as shown in FIG. 10A, a protective film 50 is formed. The protective film 50 is formed on the first mask M1, the second mask M2, and the third semiconductor region 30. The protective film 50 is made of a material including C. The material of the protective film 50 is preferably the same as the material of the first mask M1 and the material of the second mask M2.

After forming the protective film 50, annealing is performed. The first ions implanted into the second semiconductor region 20 and the second ions implanted into the third semiconductor region 30 are activated by annealing. The annealing temperature is e.g. 1600° C. or more and 1900° C. or less.

After annealing, the protective film 50 is removed. The removal of the protective film 50 may be removal of the part of the protective film 50. The protective film 50 is removed at least until the third semiconductor region 30 is exposed.

The part of the protective film 50 may be left adjacent to the second mask M2. The part of the protective film 50 is left on the third semiconductor region 30. In the case of leaving the part of the protective film 50, the thickness (X-direction thickness) of the remaining portion corresponds to the length of the first electrode 91 overlapping the third semiconductor region 30.

Figure 11A:
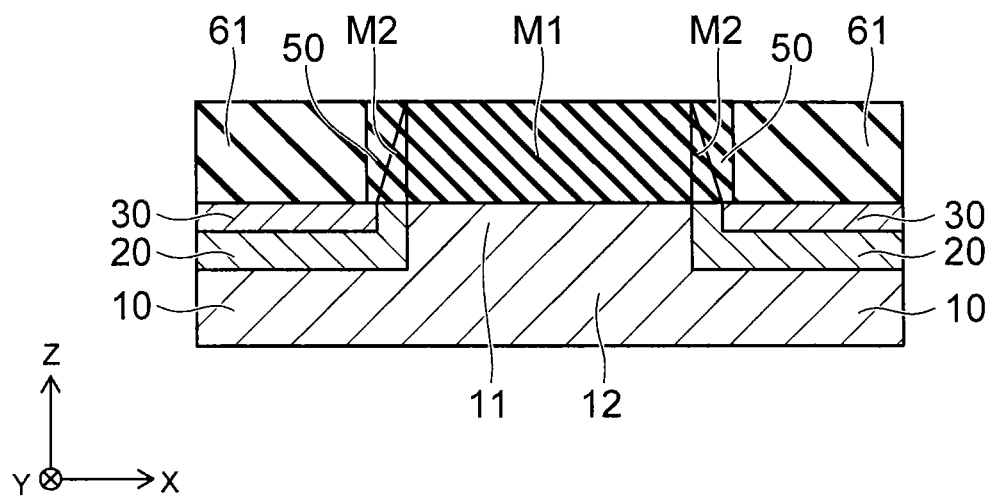
FIGS. 11A and 11B are schematic sectional views illustrating a method (III) for manufacturing a semiconductor device.

Next, as shown in FIG. 11A, a first insulating section 61 is formed. The first insulating section 61 is formed adjacent to the second mask M2. In the case where the part of the protective film 50 remains, the first insulating section 61 is formed adjacent to the protective film 50. The first insulating section 61 is made of e.g. $SiO_2$. The first insulating section 61 is formed by e.g. CVD.

Figure 11B:
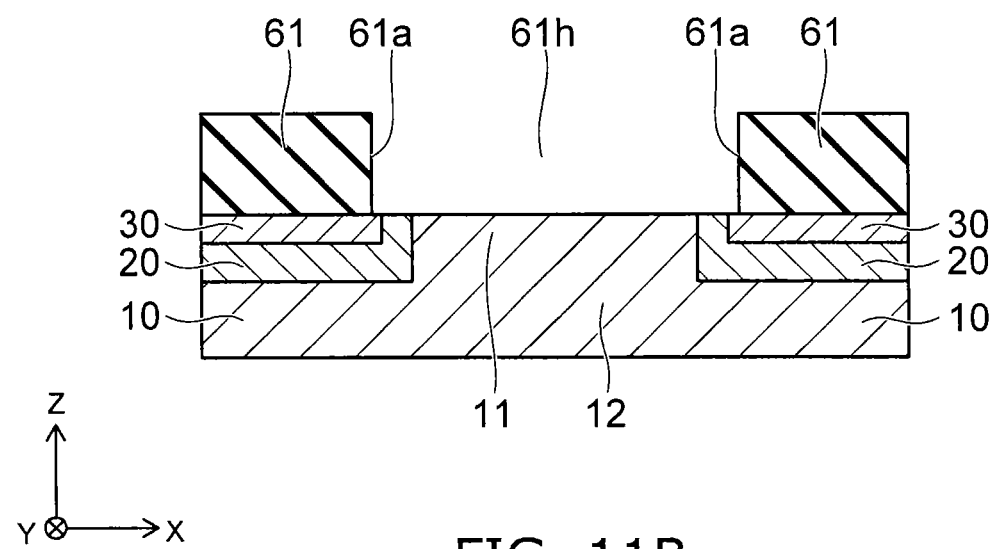

Next, as shown in FIG. 11B, the first mask M1 and the second mask M2 are removed. In the case where the part of the protective film 50 remains, the protective film 50 is also removed. The first mask M1, the second mask M2, and the protective film 50 are removed by at least one of e.g. dry etching and wet etching. This etching is performed under the condition such that the etching rate of the first mask M1, the second mask M2, and the protective film 50 is higher than the etching rate of the material of the first insulating section 61. The setting of the etching condition is facilitated in the case where the material of the first mask M1, the material of the second mask M2, and the material of the protective film 50 are the same.

A recess 61h is formed by the removal of the first mask M1, the second mask M2, and the protective film 50. In this etching, the first insulating section 61 may be slightly removed. In this case, the side surface 61a of the first insulating section 61 is set back by a prescribed amount from the end part of the third semiconductor region 30. Thus, the first semiconductor region 10, the second semiconductor region 20, and the third semiconductor region 30 are exposed at the bottom of the recess 61h.

Figure 12A:
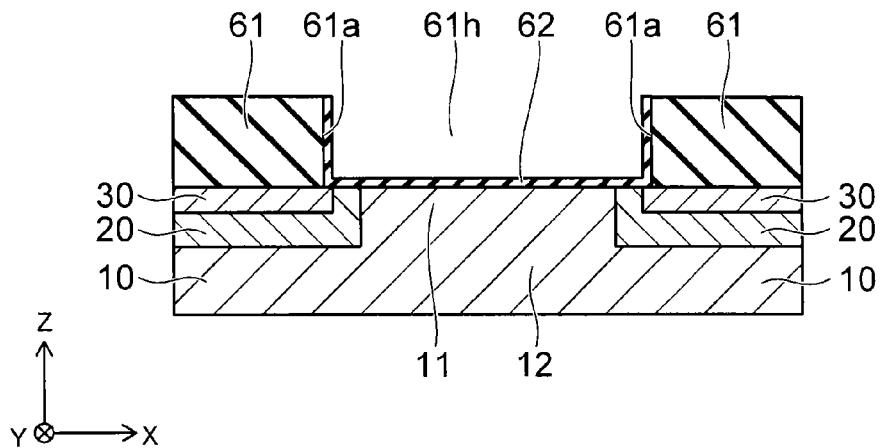
FIGS. 12A and 12B are schematic sectional views illustrating a method (III) for manufacturing a semiconductor device.
Figure 12B:
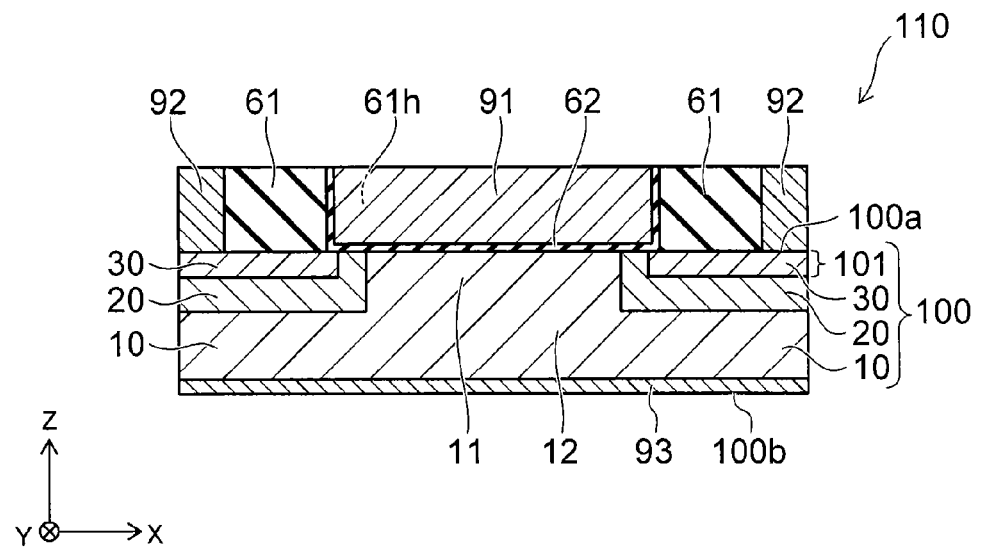

Next, as shown in FIG. 12A, a second insulating section 62 and a first electrode 91 are formed. The second insulating section 62 is formed inside the recess 61h. The second insulating section 62 is made of at least one of e.g. TEOS including $NH_3$ and SiON. In the case where the second insulating section 62 is made of SiON, it is preferable that N be added at high concentration.

The second insulating section 62 is formed by e.g. CVD. The second insulating section 62 is formed on the exposed surface of the first semiconductor region 10, the exposed surface of the second semiconductor region 20, and the exposed surface of the third semiconductor region 30 exposed from the recess 61h. The second insulating section 62 is formed also on the side surface 61a of the first insulating section 61 exposed from the recess 61h.

After forming the second insulating section 62, a first electrode 91 is formed on the second insulating section 62. The first electrode 91 is made of e.g. polycrystalline silicon. The first electrode 91 is embedded in the recess 61h via the second insulating section 62. The material of the first electrode 91 is formed in the recess 61h and on the first insulating section 61 by e.g. CVD. Then, the surface of the material of the first electrode 91 is planarized by e.g. CMP. The planarization is performed until the first insulating section 61 is exposed. Thus, the first electrode 91 is formed.

After forming the first electrode 91, a second electrode 92 and a third electrode 93 are formed. Thus, the semiconductor device 110 is completed.

By this manufacturing method, the second semiconductor region 20 is formed by self-alignment by the first mask M1. The third semiconductor region 30 is formed by self-alignment by the second mask M2. The second insulating section 62 and the first electrode 91 are formed at an accurate position by the recess 61h formed by the removal of the first mask M1 and the second mask M2.

The recess 61h corresponds to the position of the first mask M1 and the second mask M2. Thus, the second insulating section 62 and the first electrode 91 are formed substantially by self-alignment by the first mask M1 and the second mask M2.

In the semiconductor device 110 formed by this manufacturing method, the overlap of the first electrode 91 and the third semiconductor region 30 as viewed in the Z-direction is accurately formed. Even in the case where the channel length is miniaturized, each portion is formed at an accurate position. Thus, the semiconductor device 110 achieves compatibility between miniaturization and stable characteristics. Furthermore, if the material of the first mask M1 is the same as the material of the second mask M2 and the material of the protective film 50, etching for removing them is facilitated.

(Second Embodiment)

Figure 13A:
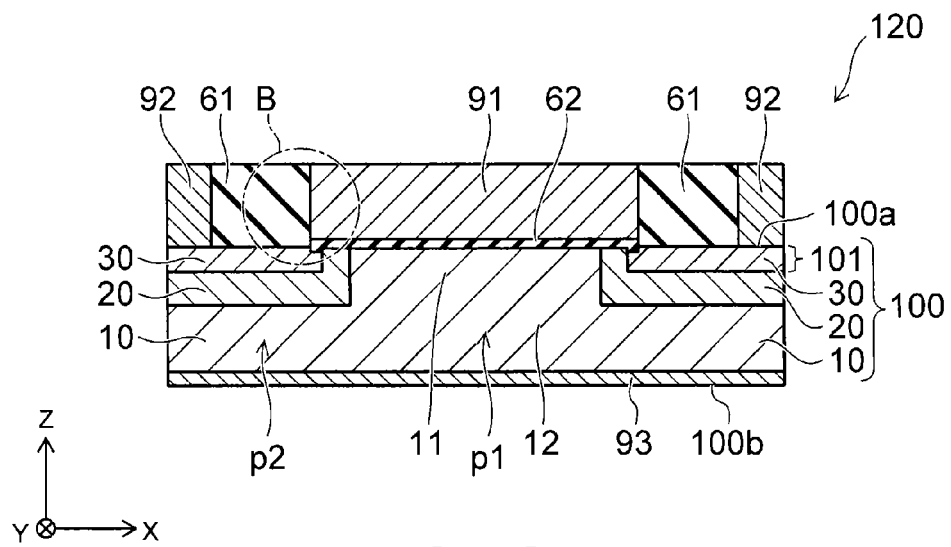
FIGS. 13A and 13B are schematic sectional views illustrating a semiconductor device according to a second embodiment.
Figure 13B:
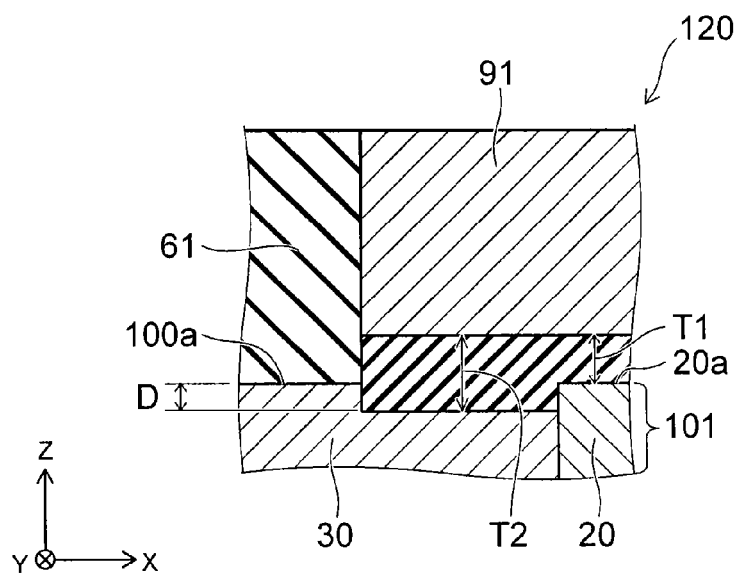

FIGS. 13A and 13B are schematic sectional views illustrating a semiconductor device according to a second embodiment.

FIG. 13A shows a schematic sectional view of the semiconductor device 120 according to the second embodiment. FIG. 13B shows a schematic sectional view enlarging a part B shown in FIG. 13A.

As shown in FIG. 13A, in the semiconductor device 120 according to the second embodiment, the first electrode 91 is in contact with the first insulating section 61.

As shown in FIG. 13B, in the semiconductor device 120, the second insulating section 62 has a first film thickness T1 and a second film thickness T2. The first film thickness T1 is the film thickness (Z-direction thickness) of the second insulating section 62 between the second semiconductor region 20 and the first electrode 91. The second film thickness T2 is the film thickness (Z-direction thickness) of the second insulating section 62 between the third semiconductor region and the first electrode 91. The second film thickness T2 is thicker than the first film thickness T1.

The semiconductor device 120 includes a first semiconductor region 10, a second semiconductor region 20, a third semiconductor region 30, a first electrode 91, a first insulating section 61, and a second insulating section 62. The first semiconductor region 10 includes silicon carbide and is of the first conductivity type. The first semiconductor region 10 includes a first part p1 and a second part p2. The second semiconductor region 20 includes silicon carbide, is provided on the second part p2, and is of the second conductivity type. The direction connecting the first part p1 and the second part p2 crosses the stacking direction (Z-direction) connecting the second part p2 and the second semiconductor region 20. The third semiconductor region 30 is provided on the part of the second semiconductor region 20, includes silicon carbide, and is of the first conductivity type. The first electrode 91 is provided on the first part p1, on another part of the second semiconductor region 20, and on the third semiconductor region 30. The end of the first electrode 91 is located on the third semiconductor region 30. The first insulating section 61 is provided on the third semiconductor region 30. The first insulating section 61 is juxtaposed with the first electrode 91 in the direction crossing the stacking direction, and is in contact with the first electrode 91. The second insulating section 62 is provided between the first electrode 91 and the first part p1, between the aforementioned other part of the second semiconductor region 20 and the first electrode 91, and between the third semiconductor region 30 and the first electrode 91. The film thickness of the second insulating section 62 between the aforementioned other part of the second semiconductor region 20 and the first electrode 91 is referred to as first film thickness T1. The film thickness of the second insulating section 62 between the third semiconductor region 30 and the first electrode 91 is referred to as second film thickness T2. The first film thickness T1 is thinner than the second film thickness T2.

The second film thickness T2 is thicker than the first film thickness T1. Thus, the gate-source capacitance is reduced. This improves the switching characteristics of the semiconductor device 120.

Here, the difference between the second film thickness T2 and the first film thickness T1 is denoted by D (D=T2−T1). Then, the semiconductor device 120 preferably satisfies D>T1/2.

In manufacturing the semiconductor device 120, the second insulating section 62 is formed by e.g. thermal oxidation. In manufacturing the semiconductor device 120, first, a recess 61h is formed by processing similar to a part of the method for manufacturing the semiconductor device 110 shown in FIGS. 3A to 5A. Next, thermal oxidation is performed. By thermal oxidation, a second insulating section 62 made of a thermal oxide film is formed on the exposed surface of the first semiconductor region 10, the second semiconductor region 20, and the third semiconductor region 30 exposed at the bottom surface of the recess 61h.

After forming the second insulating section 62, a first electrode 91 is formed on the second insulating section 62. Then, a second electrode 92 and a third electrode 93 are formed. Thus, the semiconductor device 120 is completed.

(Third Embodiment)

Figure 14A:
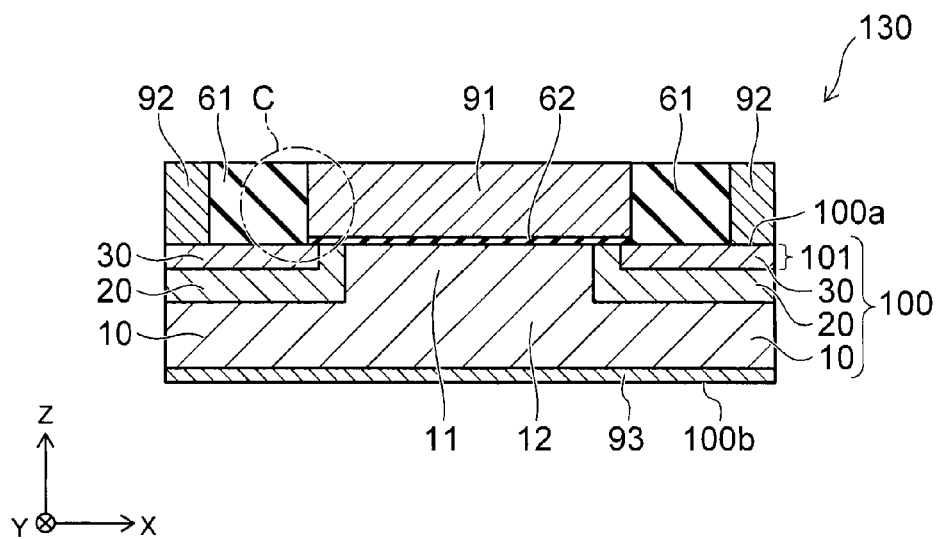
FIGS. 14A and 14B are schematic sectional views illustrating a semiconductor device according to a third embodiment.
Figure 14B:
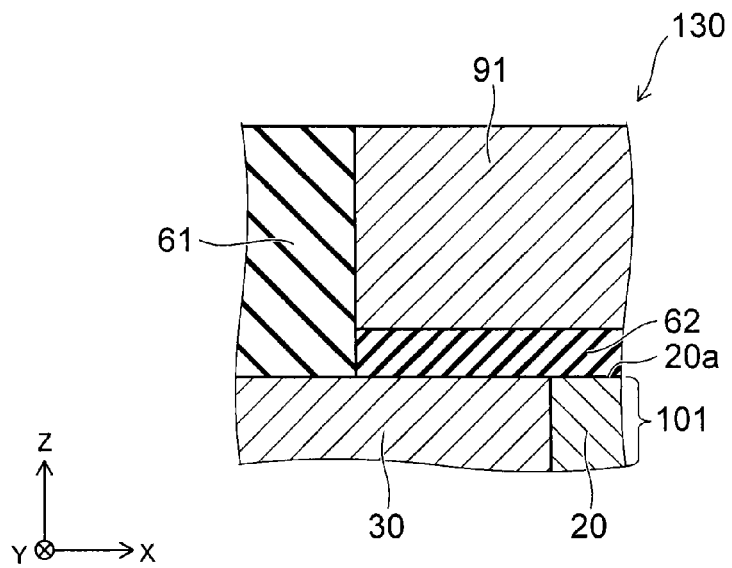

FIGS. 14A and 14B are schematic sectional views illustrating a semiconductor device according to a third embodiment.

FIG. 14A shows a schematic sectional view of the semiconductor device 130 according to the third embodiment. FIG. 14B shows a schematic sectional view enlarging a part C shown in FIG. 14A.

As shown in FIG. 14A, in the semiconductor device 130 according to the third embodiment, the first electrode 91 is in contact with the first insulating section 61.

As shown in FIG. 14B, the film thickness (Z-direction thickness) of the second insulating section 62 is nearly constant.

In manufacturing the semiconductor device 130, first, a recess 61h is formed by processing similar to a part of the method for manufacturing the semiconductor device 110 shown in FIGS. 3A to 5A. Next, a second insulating section 62 is formed on the bottom surface of the recess 61h. The second insulating section 62 is formed by a volume method with high directivity (e.g., sputtering method). Thus, a second insulating section 62 is formed with a nearly constant thickness on the exposed surface of the first semiconductor region 10, the second semiconductor region 20, and the third semiconductor region 30 exposed at the bottom surface of the recess 61h.

After forming the second insulating section 62, a first electrode 91 is formed on the second insulating section 62. Then, a second electrode 92 and a third electrode 93 are formed. Thus, the semiconductor device 130 is completed.

As described above, the present embodiments can provide a semiconductor device and a method for manufacturing the same in which a semiconductor device based on SiC can be manufactured with improved switching and other characteristics and with high accuracy.

Although the embodiment and modifications thereof are described above, the invention is not limited to these examples. For example, additions, deletions, or design modifications of components or appropriate combinations of the features of the embodiments appropriately made by one skilled in the art in regard to the embodiments or the modifications thereof described above are within the scope of the invention to the extent that the purport of the invention is included.

For instance, in the above description of the embodiments and variations, the first conductivity type is n-type, and the second conductivity type is p-type. However, the invention is also practicable when the first conductivity type is p-type and the second conductivity type is n-type. Furthermore, in the above description of the embodiments and variations, the MOSFET is taken as an example of the semiconductor device. However, the invention is not limited thereto. The semiconductor device is also applicable to a device having the MOS structure such as IGBT (insulated gate bipolar transistor).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first electrode;
a first insulating section arranged with the first electrode in a first direction;
a first semiconductor region including silicon carbide, the first semiconductor region being of a first conductivity type and including a first semiconductor part and a second semiconductor part, the first semiconductor part overlapping the first electrode in a second direction crossing the first direction, the second semiconductor part overlapping the first insulating section in the second direction;
a second semiconductor region including silicon carbide, the second semiconductor region being of a second conductivity type, a part of the second semiconductor region being provided between the first insulating section and the second semiconductor part in the second direction, another part of the second semiconductor region being provided between the first electrode and the second semiconductor part in the second direction;
a third semiconductor region including silicon carbide, the third semiconductor region being of the first conductivity type and provided between the first insulating section and the part of the second semiconductor region in the second direction, at least a part of the another part of the second semiconductor region being provided between the third semiconductor region and the first semiconductor part in the first direction; and
a second insulating section including
a first insulating part provided between the first electrode and the first semiconductor part in the second direction,
a second insulating part provided between the first electrode and the first insulating section in the first direction,
a material of the second insulating section being different from a material of the first insulating section.

2. The device according to claim 1, wherein the first electrode includes
a first surface opposing the first insulating part,
a second surface opposing the second insulating part, and
a third surface connecting the first surface with the second surface,
the third surface being curved, and
a part of the third surface is perpendicular to a third direction inclined with respect to the first and second directions.

3. The device according to claim 2, wherein $R > Tox \times (3^{1/2} - 1)$ is satisfied, where R is a curvature radius of the third surface, and Tox is a thickness of the first insulating part in the second direction.

4. The device according to claim 2, wherein
a distance between the part of the third surface and the third semiconductor region in the third direction is larger than a first thickness of the first insulating part in the second direction.

5. The device according to claim 1, wherein
the first electrode has a first face on a side of the first insulating part and a second face opposite to the first face, the second face crossing the second direction, the first insulating section has a third face on a side of the third semiconductor region and a fourth face opposite the third face, the fourth face crossing the second direction, and the second face is included in a plane including the fourth face.

6. The device according to claim 1, further comprising a second electrode electrically connected with the third semiconductor region, the first insulating section being provided between the second insulating part and at least a part of the second electrode in the first direction.

7. The device according to claim 4, wherein the distance is larger than a second thickness of the second insulating part in the first direction.

* * * * *